(12) United States Patent
Kadomi et al.

(10) Patent No.: US 9,859,479 B2
(45) Date of Patent: Jan. 2, 2018

(54) LIGHT-EMITTING DEVICE INCLUDING QUANTUM DOTS

(71) Applicant: NIPPON ELECTRIC GLASS CO., LTD., Ostu-shi, Shiga (JP)

(72) Inventors: Masaaki Kadomi, Otsu (JP); Hideki Asano, Otsu (JP); Takashi Nishimiya, Otsu (JP)

(73) Assignee: NIPPON ELECTRIC GLASS CO., LTD, Shiga (JP)

( * ) Notice: Subject to any disclaimer, the term of this patent is extended or adjusted under 35 U.S.C. 154(b) by 0 days.

(21) Appl. No.: 15/304,286

(22) PCT Filed: May 19, 2015

(86) PCT No.: PCT/JP2015/064303
§ 371 (c)(1),
(2) Date: Oct. 14, 2016

(87) PCT Pub. No.: WO2015/190241
PCT Pub. Date: Dec. 17, 2015

(65) Prior Publication Data
US 2017/0040509 A1    Feb. 9, 2017

(30) Foreign Application Priority Data

Jun. 9, 2014    (JP) ................... 2014-118732

(51) Int. Cl.
*H01L 33/50*    (2010.01)
*H01L 33/54*    (2010.01)
*H01L 33/60*    (2010.01)

(52) U.S. Cl.
CPC .............. *H01L 33/54* (2013.01); *H01L 33/50* (2013.01); *H01L 33/502* (2013.01);
(Continued)

(58) Field of Classification Search
CPC ......... H01L 33/06; H01L 33/22; H01L 33/50; H01L 33/507; H01L 33/52; H01L 33/54;
(Continued)

(56) References Cited

U.S. PATENT DOCUMENTS

2009/0272996 A1*  11/2009  Chakraborty ......... H01L 33/501
                                                    257/98
2009/0281234 A1*  11/2009  Ando ....................... B29B 7/88
                                                    524/577
(Continued)

FOREIGN PATENT DOCUMENTS

JP    2000-31547 A    1/2000
JP    2010-126596 A   6/2010
(Continued)

OTHER PUBLICATIONS

Official Communication issued in International Patent Application No. PCT/JP2015/064303, dated Jul. 14, 2015.

*Primary Examiner* — Stephen W Smoot
(74) *Attorney, Agent, or Firm* — Keating and Bennett, LLP (57) ABSTRACT

Provided is a light-emitting device with quantum dots that has a small in-plane variation in luminescence intensity. A light-emitting device (1) includes a light-emitting part (11), a cell (10), a light source (12), and an incident light scatting part. The light-emitting part (11) contains quantum dots. The cell (10) encapsulates the light-emitting part (11). The light source (12) emits light at a wavelength exciting the quantum dots to the light-emitting part (11). The incident light scatting part is disposed between the light source (12) and the light-emitting part (11). The incident light scatting part scatters light incident on the light-emitting part (11).

11 Claims, 4 Drawing Sheets

(52) U.S. Cl.
CPC ............ *H01L 33/507* (2013.01); *H01L 33/60* (2013.01); *H01L 2933/0091* (2013.01)

(58) Field of Classification Search
CPC ............ H01L 33/60; H01L 2933/0091; Y10S 977/774
See application file for complete search history.

(56) References Cited

U.S. PATENT DOCUMENTS

| | | |
|---|---|---|
| 2010/0193806 A1 | 8/2010 | Byun |
| 2013/0193837 A1 | 8/2013 | Ohno et al. |
| 2014/0021503 A1 | 1/2014 | Yoshida et al. |
| 2014/0133159 A1 | 5/2014 | Asano et al. |
| 2015/0261076 A1* | 9/2015 | Dijken .................. H01L 33/507 359/326 |

FOREIGN PATENT DOCUMENTS

| | | |
|---|---|---|
| JP | 2010-177656 A | 8/2010 |
| JP | 2013-16583 A | 1/2013 |
| JP | 2013-33833 A | 2/2013 |
| JP | 2013-153105 A | 8/2013 |
| JP | 2014-67965 A | 4/2014 |
| WO | 2012/132232 A1 | 10/2012 |

* cited by examiner

LIGHT-EMITTING DEVICE INCLUDING QUANTUM DOTS

TECHNICAL FIELD

This invention relates to light-emitting devices.

BACKGROUND ART

Recently, light-emitting devices using light-emitting diodes have made remarkable progress and are being employed in backlights of liquid crystal displays, large-sized displays, and so on. Particularly, development in semiconductor materials for short wavelength light-emitting elements has enabled provision of short-wavelength light. Thus, by exciting a phosphor using short-wavelength light, light with more various wavelengths has become available.

Light-emitting devices have heretofore been known in which quantum dots are used. For example, Patent Literature 1 discloses a light-emitting device which includes a blue LED and an encapsulating portion encapsulating the blue LED and in which the encapsulating portion is made of a resin composition containing quantum dots.

CITATION LIST

Patent Literature

Patent Literature 1: JP-A 2010-126596

SUMMARY OF INVENTION

Technical Problem

The intensity of light emitted from a light source, such as a blue LED, is highest on the optical axis and gradually becomes lower with distance from the optical axis. Therefore, the intensity of light incident on a portion of a quantum dot-containing light-emitting part located on the optical axis is high, whereas the intensity of light incident on portions thereof away from the optical axis is low. Hence, there is a problem that the luminescence intensity of the light-emitting device is high at the center thereof and gradually decreases toward the periphery. In short, there is a problem of an in-plane variation in luminescence intensity.

A principal object of the present invention is to provide a light-emitting device with quantum dots that has a small in-plane variation in luminescence intensity.

Solution to Problem

A light-emitting device according to the present invention includes a light-emitting part, a cell, a light source, and an incident light scattering part. The light-emitting part contains quantum dots. The cell encapsulates the light-emitting part. The light source emits light at a wavelength exciting the quantum dots to the light-emitting part. The incident light scattering part is disposed between the light source and the light-emitting part. The incident light scattering part scatters light incident on the light-emitting part.

In the light-emitting device according to the present invention, the incident light scattering part may contain a light scattering material.

In the light-emitting device according to the present invention, the incident light scattering part may be a sintered body having a grain boundary.

In the light-emitting device according to the present invention, the incident light scattering part may include an irregular surface that scatters light incident on the light-emitting part.

In the light-emitting device according to the present invention, the incident light scattering part may be disposed between the cell and the light source.

In the light-emitting device according to the present invention, the cell may include a first main wall portion, a second main wall portion located on an side of the first main wall portion opposite to the light source, and a side wall portion connecting between the first main wall portion and the second main wall portion. In this case, the first main wall portion may constitute the incident light scattering part.

In the light-emitting device according to the present invention, the second main wall portion may contain a light scattering material.

In the light-emitting device according to the present invention, the second main wall portion may be a sintered body having a grain boundary.

In the light-emitting device according to the present invention, the second main wall portion may include an irregular surface that scatters light emitted from the light-emitting part.

In the light-emitting device according to the present invention, the side wall portion may be made of metal.

In the light-emitting device according to the present invention, each of the first and second main wall portions preferably has a thickness of 1 mm or less.

In the light-emitting device according to the present invention, the first and second main wall portions preferably have a refractive index of 1.70 or less.

The light-emitting device according to the present invention may further include a reflective member located laterally of the light-emitting part.

In the light-emitting device according to the present invention, the light-emitting part may contain a light scattering material.

Advantageous Effects of Invention

The present invention can provide a light-emitting device with quantum dots that has a small in-plane variation in luminescence intensity.

DESCRIPTION OF EMBODIMENTS

Hereinafter, a description will be given of preferred embodiments for working of the present invention. However, the following embodiments are simply illustrative. The present invention is not at all limited to the following embodiments.

Throughout the drawings to which the embodiments and the like refer, elements having substantially the same functions will be referred to by the same reference signs. The drawings to which the embodiments and the like refer are schematically illustrated. The dimensional ratios and the like of objects illustrated in the drawings may be different from those of the actual objects. Different drawings may have different dimensional ratios and the like of the objects. Dimensional ratios and the like of specific objects should be determined in consideration of the following descriptions.

First Embodiment

Figure 1:
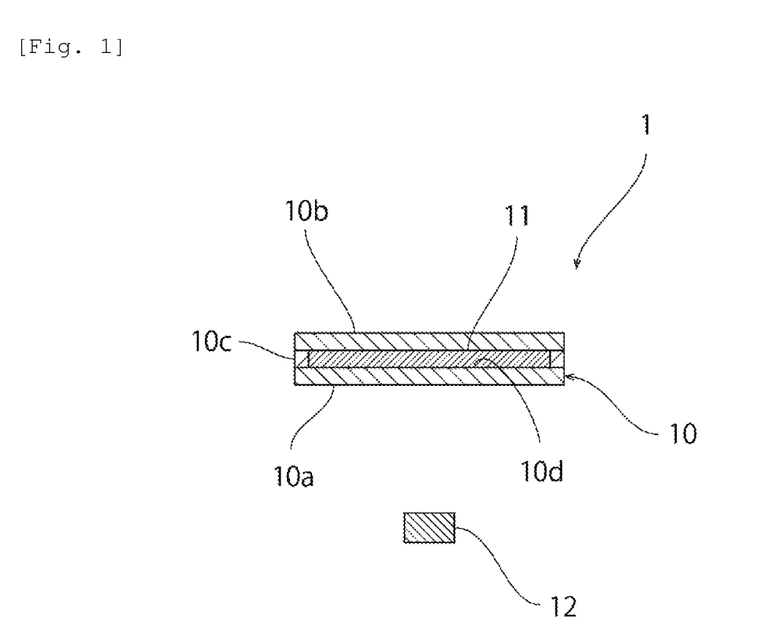
FIG. 1 is a schematic cross-sectional view of a light-emitting device according to a first embodiment.

FIG. 1 is a schematic cross-sectional view of a light-emitting device 1 according to a first embodiment.

The light-emitting device 1 is a device that, upon incidence of excitation light, emits light at a different wavelength from the excitation light. The light-emitting device 1 may be configured to emit mixed light of the excitation light and light produced upon irradiation with the excitation light.

The light-emitting device 1 includes a cell 10. The cell 10 includes a first main wall portion 10a, a second main wall portion 10b, and a side wall portion 10c. The first main wall portion 10a and the second main wall portion 10b face each other and are spaced apart from each other.

In this embodiment, each of the first and second main wall portions 10a, 10b has the shape of a flat plate. Each of the first and second main wall portions 10a, 10b may have, for example, a rectangular surface profile or may have a polygonal, circular, polycircular, oval or other surface profiles.

Each of the first and second main wall portions 10a, 10b preferably has a thickness of 1.0 mm or less and more preferably a thickness of 0.5 mm or less. By reducing the thickness of the first and second main wall portions 10a, 10b, the light extraction efficiency can be increased.

Each of the first and second main wall portions 10a, 10b can be made of, for example, glass, ceramic, resin or other materials. Note that in the present invention glass is intended to include crystallized glass. Each of the first and second main wall portions 10a, 10b preferably has a refractive index of 1.70 or less and more preferably a refractive index of 1.60 or less. By reducing the refractive index of the first and second main wall portions 10a, 10b, the light extraction efficiency can be increased.

The side wall portion 10c is provided between the first main wall portion 10a and the second main wall portion 10b. The side wall portion 10c is bonded to each of the first main wall portion 10a and the second main wall portion 10b. Specifically, the side wall portion 10c is bonded to the respective peripheral portions of the first and second main wall portions 10a, 10b. The side wall portion 10c and the first and second main wall portions 10a, 10b define an interior space 10d. The interior space 10d can have a thickness of, for example, about 0.1 mm to about 5 mm.

The side wall portion 10c may be formed of, for example, a single frame-like or tubular member or may be formed of a plurality of band-like members.

The side wall portion 10c may be made of, for example, glass, ceramic or at least one metal selected from aluminum, copper, iron, and their alloys.

No particular limitation is placed on the method for bonding the side wall portion 10c to the first and second main wall portions 10a, 10b. The bonding of the side wall portion 10c to the first and second main wall portions 10a, 10b can be made by, for example, welding, such as laser welding, anodic bonding or bonding with an inorganic bonding material, such as a solder.

A light-emitting part 11 is provided in the interior space 10d. The light-emitting part 11 is encapsulated by the cell 10. The light-emitting part 11 may be provided in the whole of the interior space 10d or in part of the interior space 10d.

The light-emitting part 11 contains quantum dots. The light-emitting part 11 may contain a single type of quantum dots or a plurality of types of quantum dots.

The quantum dots emit, upon incidence of excitation light for the quantum dots, light at a different wavelength from the excitation light. The wavelength of light emitted from the quantum dots depends on the particle size of the quantum dots. In other words, by changing the particle size of the quantum dots, the wavelength of the resultant light can be controlled. Therefore, the particle size of the quantum dots is selected to be a particle size meeting a desired wavelength of light. The particle size of the quantum dots is generally about 2 nm to about 10 nm.

For example, specific examples of the quantum dots that produce blue visible light (fluorescence at a wavelength of 440 nm to 480 nm) upon irradiation with ultraviolet to near-ultraviolet excitation light at a wavelength of 300 nm to 440 nm include CdSe/ZnS nanocrystals having a particle size of about 2.0 nm to about 3.0 nm. Specific examples of the quantum dots that produce green visible light (fluorescence at a wavelength of 500 nm to 540 nm) upon irradiation with ultraviolet to near-ultraviolet excitation light at a wavelength of 300 nm to 440 nm or blue excitation light at a wavelength of 440 nm to 480 nm include CdSe/ZnS nanocrystals having a particle size of about 3.0 nm to about 3.3 nm. Specific examples of the quantum dots that produce yellow visible light (fluorescence at a wavelength of 540 nm to 595 nm) upon irradiation with ultraviolet to near-ultraviolet excitation light at a wavelength of 300 nm to 440 nm or blue excitation light at a wavelength of 440 nm to 480 nm include CdSe/ZnS nanocrystals having a particle size of about 3.3 nm to about 4.5 nm. Specific examples of the quantum dots that produce red visible light (fluorescence at a wavelength of 600 nm to 700 nm) upon irradiation with ultraviolet to near-ultraviolet excitation light at a wavelength of 300 nm to 440 nm or blue excitation light at a wavelength of 440 nm to 480 nm include CdSe/ZnS nanocrystals having a particle size of about 4.5 nm to about 10 nm.

The light-emitting part 11 contains quantum dots and a dispersion medium for the quantum dots. The dispersion medium may be, for example, in liquid form or in solid form of resin or the like. The light-emitting part 11 may further contain, in addition to the quantum dots and the dispersion medium, for example, a light scattering material. Specific examples of the light scattering material that can be preferably used include highly reflective inorganic compound particles, such as alumina particles, titania particles, and silica particles, and white, highly reflective resin particles. If the light-emitting part 11 contains a light scattering material, the in-plane variation in luminescence intensity of the light-emitting part 11 can be reduced.

If the light-emitting part 11 is made of a solid, the light-emitting part 11 may be formed of, for example, a laminate of a plurality of light-emitting layers. In this case, the plurality of light-emitting parts may contain the same type of quantum dots or different types of quantum dots.

The light-emitting device 1 includes a light source 12. The light source 12 is disposed on the side of the cell 10 close to the first main wall portion 10a. The second main wall portion 10b is located on the side of the first main wall portion 10a opposite to the light source 12. In this embodiment, the light source 12 is disposed spaced apart from the cell 10. However, the present invention is not limited to this configuration. The light source may be disposed in contact with the cell. In other words, the first main wall portion of the cell may be disposed directly on the light source. If the first main wall portion of the cell is disposed directly on the light source, intensity unevenness of light emitted from the light source can be reduced and in turn the in-plane variation in luminescence intensity of the light-emitting part 11 can be reduced.

The light source 12 emits light at a wavelength exciting the quantum dots to the light-emitting part 11 encapsulated by the cell 10. The light source 12 can be formed of, for example, an LED (light-emitting diode) element, an LD (laser diode) element or the like. In this embodiment, a description will be given of an example where the light source 12 is formed of an LED.

In this embodiment, the light source 12 is smaller than the light-emitting part 11. The light source 12 emits diverging light to the light-emitting part 11.

Generally, regardless of the type of light source, light emitted from the light source has an intensity distribution. The intensity of emitted light is highest on the optical axis of the light source and gradually becomes lower with distance from the optical axis. Therefore, the intensity of light incident on a portion of the light-emitting part located on the optical axis of the light source is relatively high, whereas the intensity of light incident on portions thereof away from the optical axis is relatively low. Hence, the intensity of light emitted from the portion of the light-emitting part located on the optical axis of the light source is relatively high, whereas the intensity of light emitted from the portions thereof away from the optical axis is relatively low. As a result, in-plane variations in luminescence intensity occurs.

In the light-emitting device 1, the first main wall portion 10a located between the light source 12 and the light-emitting part 11 contains a light scattering material and therefore has an additional function as an incident light scattering part. Therefore, the in-plane variation in intensity of light incident on the light-emitting part can be reduced. In other words, incident light (excitation light) can be supplied at a uniform intensity to the light-emitting part 11. Hence, the in-plane variation in luminescence intensity of the light-emitting device 1 can be reduced.

In this embodiment, a description has been given of an example where the main wall portion constitutes an incident light scattering part by containing a light scattering material. However, the present invention is not limited to this configuration. For example, the first main wall portion 10a may constitute an incident light scattering part using a sintered body having a grain boundary or a sintered body having a grain boundary in which a light scattering material is contained.

Furthermore, in order to further reduce the intensity unevenness of light incident on the light-emitting part 11, the surface of the first main wall portion 10a may be provided with an irregular surface that scatters light incident on the light-emitting part 11 and the irregular surface may constitute an incident light scattering part. In this case, the surface roughness of the irregular surface constituting the incident light scattering part is, in terms of root-mean-square roughness (RMS), preferably 5 nm to 100 nm and more preferably 10 nm to 50 nm. If the surface roughness of the irregular surface constituting the incident light scattering part is too small, the effect of scattering light incident on the light-emitting part 11 is difficult to obtain. On the other hand, if the surface roughness of the irregular surface constituting the incident light scattering part is too large, light emitted from the light source 12 is likely to reflect on the surface of the incident light scattering part, so that the amount of light incident on the light-emitting part 11 is reduced and therefore the conversion efficiency is likely to decrease.

In the light-emitting device 1, the light-emitting part 11 contains a light scattering material. Therefore, light scattering also occurs within the light-emitting part 11. Hence, the in-plane variation in luminescence intensity can be further reduced.

In the light-emitting device 1, not only the first main wall portion 10a but also the second main wall portion 10b contain a light scattering material. The second main wall portion 10b has an additional function as an exiting light scattering part that scatters exiting light. Therefore, light emitted from the light-emitting part 11 is scattered in the second main wall portion 10b. Hence, the in-plane variation in luminescence intensity of the light-emitting device 1 can be further reduced.

Instead of allowing the second main wall portion 10b to contain a light scattering material, a sintered body having a grain boundary or a sintered body having a grain boundary in which a light scattering material is contained may be used. In addition, the surface of the second main wall portion 10b may be provided with an irregular surface that scatters light emitted from the light-emitting part 11. In providing the surface of the second main wall portion 10b with an irregular surface, the roughness of the irregular surface in the surface of the second main wall portion 10b is, in terms of root-mean-square roughness (RMS), preferably 5 nm to 100 nm and more preferably 10 nm to 50 nm. If the surface roughness of the second main wall portion 10b is too small, the effect of scattering light emitted from the light-emitting part 11 to reduce the in-plane variation in luminescence intensity of the light-emitting device 1 is difficult to obtain. On the other hand, if the surface roughness of the second main wall portion 10b is too large, light converted by the light-emitting part 11 is likely to reflect on the surface of the second main wall portion 10b and go back toward the light source 12, so that the light extraction efficiency is likely to decrease.

From the viewpoint of reducing the in-plane variation in luminescence intensity of the light-emitting device 1 and concurrently increasing the luminescence intensity of the light-emitting device 1, the side wall portion 10c is preferably made of metal. If the side wall portion 10c is made of metal, light going from the light-emitting part 11 toward the side wall portion 10c reflects on the side wall portion 10c. The reflected light exits mainly from the peripheral portion of the light-emitting device 1. Therefore, the luminescence intensity at the peripheral portion of the light-emitting device 1 is increased. Hence, the in-plane variation in luminescence intensity of the light-emitting device 1 can be further reduced. In addition, the efficiency with which light from the light-emitting part 11 is extracted through the second main wall portion 10b can be increased.

It is not necessarily required that the entire side wall portion 10c is made of metal. For example, the side wall portion 10c may be made of a glass material and a reflective film, such as a metal layer or a white coating, covering at least part of the surface of the glass material.

In the light-emitting device 1, it is desired that the efficiency of extraction of light from the light-emitting part 11 or mixed light of light from the light-emitting part 11 and light from the light source 12 should be high. From this point of view, each of the first and second main wall portions 10a, 10b preferably has a thickness of 1.0 mm or less and more preferably a thickness of 0.5 mm or less. However, if the thickness of each of the first and second main wall portions 10a, 10b is too small, the mechanical strength of the first and second main wall portions 10a, 10b may be excessively low. Therefore, each of the first and second main wall portions 10a, 10b preferably has a thickness of not less than 0.005 mm. Furthermore, each of the first and second main wall portions 10a, 10b preferably has a refractive index of 1.70 or less and more preferably a refractive index of 1.60 or less. The refractive index of each of the first and second main wall portions 10a, 10b is generally not less than 1.46. Hereinafter, a description will be given of other exemplary preferred embodiments of the present invention. In the descriptions below, elements having functions substantially in common with the first embodiment will be referred to by the common reference signs and further explanation thereof will be omitted.

Second Embodiment

Figure 2:
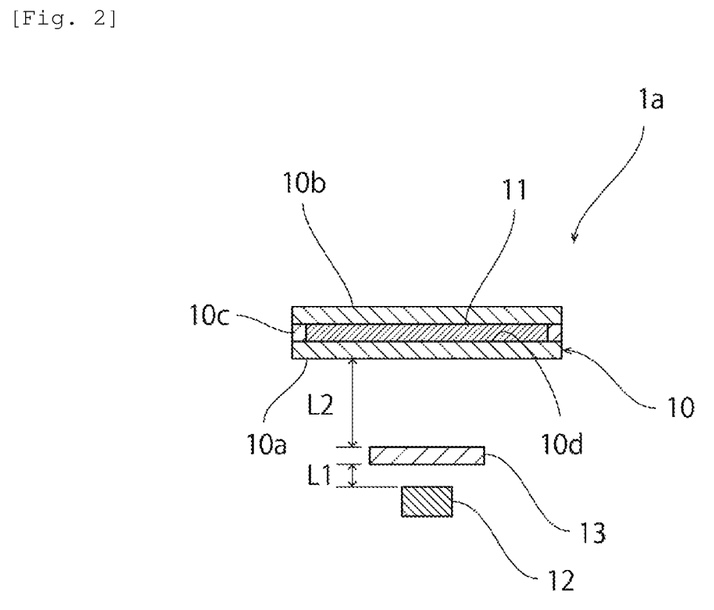
FIG. 2 is a schematic cross-sectional view of a light-emitting device according to a second embodiment.

FIG. 2 is a schematic cross-sectional view of a light-emitting device 1a according to a second embodiment.

In the light-emitting device 1 according to the first embodiment, a description has been given of an example where the first main wall portion 10a constitutes an incident light scattering part. However, the present invention is not limited to this configuration.

As shown in FIG. 2, in the light-emitting device 1a according to the second embodiment, an incident light scattering part 13 is disposed separately from the cell 10. The incident light scattering part 13 can be formed of, for example, a glass sheet, a resin sheet, a ceramic sheet or the like that contain a light scattering material. Alternatively, the incident light scattering part 13 can be formed of, for example, a glass sheet, a resin sheet, a ceramic sheet or the like the surface of which includes an irregular surface that scatters light. For example, the incident light scattering part 13 may have a surface including an irregular surface and contain a light scattering material.

The incident light scattering part 13 is disposed between the cell 10 encapsulating the light-emitting part 11 and the light source 12. The incident light scattering part 13 may be provided, for example, immediately above the light source 12, immediately beneath the first main wall portion 10a of the cell 10 or spaced apart from both the light source 12 and the cell 10. For example, from the viewpoint of further reducing the intensity unevenness of light emitted from the light source 12, the incident light scattering part 13 is preferably disposed close to the light source 12. Furthermore, by disposing the incident light scattering part 13 close to the light source 12, the area of the incident light scattering part 13 can be reduced. Where the distance between the light source 12 and the incident light scattering part 13 is L1 and the distance between the incident light scattering part 13 and the cell 10 is L2, then L1/L2 is preferably 10 or less and more preferably 8 or less. If L1/L2 is too large, the incident light scattering part 13 must be increased in size, which makes it difficult to reduce the size of the light-emitting device.

Third Embodiment

Figure 3:
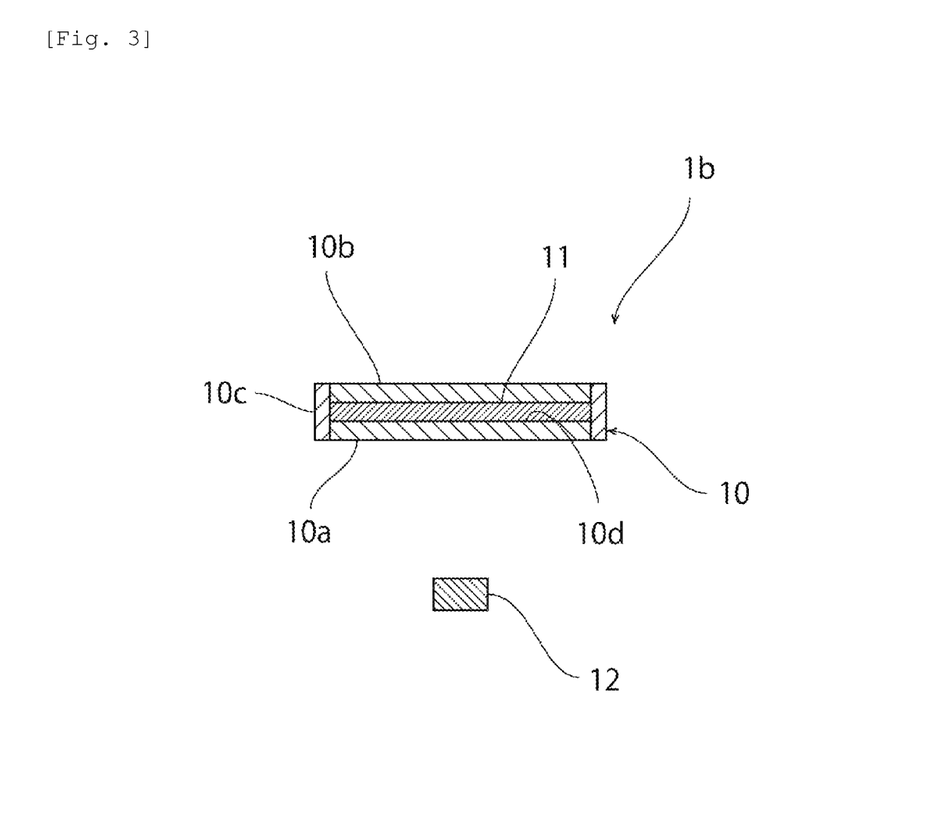
FIG. 3 is a schematic cross-sectional view of a light-emitting device according to a third embodiment.

FIG. 3 is a schematic cross-sectional view of a light-emitting device 1b according to a third embodiment.

In the first and second embodiments, a description has been given of an example where the side wall portion 10c connects between a surface of the first main wall portion 10a close to the second main wall portion 10b and a surface of the second main wall portion 10b close to the first main wall portion 10a. However, the present invention is not limited to this configuration.

As shown in FIG. 3, in the light-emitting device 1b, the side wall portion 10c is provided from one end to the other end of the cell 10 in the thickness direction. The side wall portion 10c forms the entire side surface of the cell 10. The side wall portion 10c is connected to the end surfaces of the first and second main wall portions 10a, 10b.

Also in the light-emitting device 1b, the side wall portion 10c is preferably formed of a reflective member, such as a metallic material. If the side wall portion 10c provided from one end to the other end of the cell 10 in the thickness direction is formed of a reflective member, the efficiency with which light emitted laterally from the light-emitting part 11 is extracted through the peripheral portion of the second main wall portion 10b can be further increased. Therefore, the in-plane variation in luminescence intensity of the light-emitting device 1b can be further reduced and the luminescence intensity of the light-emitting device 1b can be further increased.

Fourth Embodiment

Figure 4:
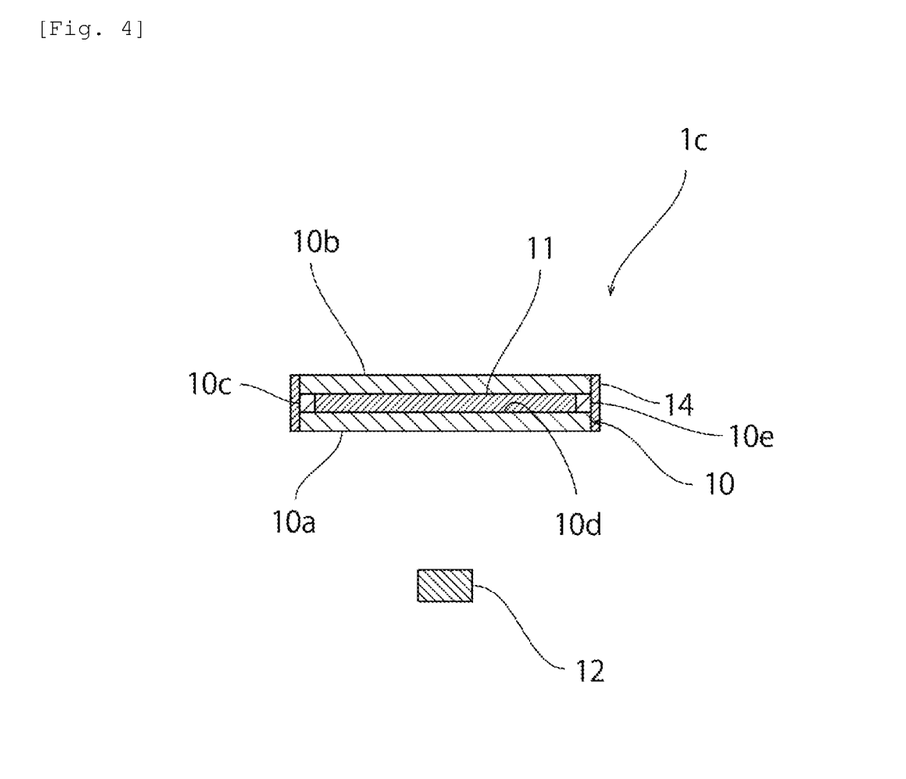
FIG. 4 is a schematic cross-sectional view of a light-emitting device according to a fourth embodiment.

FIG. 4 is a schematic cross-sectional view of a light-emitting device 1c according to a fourth embodiment.

In the light-emitting device 1c according to the fourth embodiment, the side wall portion 10c is formed of a light-transmissive member, such as a glass material. A reflective member 14 is disposed on the side surface 10e of the cell 10. In this embodiment, the reflective member 14 is provided to cover substantially the entire side surface 10e. By providing the reflective member 14, the efficiency with which light emitted laterally from the light-emitting part 11 is extracted through the peripheral portion of the second main wall portion 10b can be further increased. Therefore, the in-plane variation in luminescence intensity of the light-emitting device 1c can be further reduced and the luminescence intensity of the light-emitting device 1c can be further increased.

REFERENCE SIGNS LIST 1, 1a, 1b, 1c light-emitting device
10 cell
10a first main wall portion
10b second main wall portion
10c side wall portion
10d interior space
10e side surface
11 light-emitting part
12 light source
13 incident light scattering part
14 reflective member

The invention claimed is:
1. A light-emitting device comprising:
a light-emitting part containing quantum dots;
a cell encapsulating the light-emitting part;
a light source that emits light at a wavelength exciting the quantum dots to the light-emitting part; and
an incident light scattering part that contains a light scattering material and scatters light incident on the light-emitting part; wherein
the cell comprises:
a first main wall portion;
a second main wall portion located on a side of the first main wall portion opposite to the light source; and
a side wall portion connecting between the first main wall portion and the second main wall portion; and
the first main wall portion constitutes the incident light scattering part.

2. The light-emitting device according to claim 1, wherein the incident light scattering part is formed of a sintered body having a grain boundary.

3. The light-emitting device according to claim 1, wherein the incident light scattering part has an irregular surface that scatters light incident on the light-emitting part.

4. The light-emitting device according to claim 1, wherein the second main wall portion contains a light scattering material.

5. The light-emitting device according to claim 1, wherein the second main wall portion is formed of a sintered body having a grain boundary.

6. The light-emitting device according to claim 1, wherein the second main wall portion has an irregular surface that scatters light emitted from the light-emitting part.

7. The light-emitting device according to claim 1, wherein the side wall portion is made of metal.

8. The light-emitting device according to claim 1, wherein each of the first and second main wall portions has a thickness of 1.0 mm or less.

9. The light-emitting device according to claim 1, wherein the first and second main wall portions have a refractive index of 1.70 or less.

10. The light-emitting device according to claim 1, further comprising a reflective member located laterally of the light-emitting part.

11. The light-emitting device according to claim 1, wherein the light-emitting part contains a light scattering material.

* * * * *